United States Patent [19]
Basavanhally

[11] Patent Number: 5,700,987
[45] Date of Patent: Dec. 23, 1997

[54] ALIGNMENT AND BONDING TECHNIQUES

[75] Inventor: Nagesh Ramamoorthy Basavanhally, Trenton, N.J.

[73] Assignee: Lucent Technologies Inc., Murray Hill, N.J.

[21] Appl. No.: 615,562

[22] Filed: Mar. 15, 1996

Related U.S. Application Data

[62] Division of Ser. No. 260,860, Jun. 16, 1994, Pat. No. 5,568,892.
[51] Int. Cl.$^6$ .............................. B23K 1/00; B23K 3/053
[52] U.S. Cl. .............. 219/56.1; 219/56.22; 219/85.18; 219/209; 228/180.21; 361/760; 361/779
[58] Field of Search ........................ 219/56.1, 56.22, 219/88.1, 85.16, 85.18, 209, 535; 228/180.21, 180.22, 225, 227; 385/49, 91, 92; 361/760, 768, 779; 437/209; 257/723, 724, 737, 786

[56] References Cited

U.S. PATENT DOCUMENTS

| | | | |
|---|---|---|---|
| 3,298,046 | 1/1967 | Carr | 219/85.1 |
| 3,384,958 | 5/1968 | Christian et al. | 228/227 |
| 3,486,223 | 12/1969 | Butera | 228/227 |
| 3,660,632 | 5/1972 | Leinkram | 228/227 |
| 4,119,363 | 10/1978 | Camlibel et al. | 250/522 |
| 4,374,316 | 2/1983 | Inamori et al. | 219/209 |
| 4,481,403 | 11/1984 | Del Monte | 219/209 |
| 4,728,787 | 3/1988 | Henry et al. | 250/227 |
| 4,756,592 | 7/1988 | Sasayama et al. | 385/91 |

(List continued on next page.)

FOREIGN PATENT DOCUMENTS

| | | | |
|---|---|---|---|
| 2 251 997 | 5/1974 | Germany | 228/119 |
| 299855 | 12/1988 | Japan | 228/225 |
| 6-201954 | 7/1994 | Japan . | |
| 399086 | 2/1974 | U.S.S.R. | 219/209 |
| 1 360927 | 12/1987 | U.S.S.R. | 228/227 |

OTHER PUBLICATIONS

Module Removal by Inlaid Heater Modules, IBM Technical Disclosure Bulletin, vol. 12, No. 8, pp. 1193–1194, Jan. 1970.
Research Disclosure, "Repair Technique for Area Array Solder Interconnections", Kenneth Mason Publications Ltd, England, Jun. 1991, No. 326.

Primary Examiner—Teresa J. Walberg
Assistant Examiner—J. Pelham
Attorney, Agent, or Firm—Vernon E. Williams; Patricia A. Verlangieri

[57] ABSTRACT

A method for aligning and soldering a first device (11) to a substrate (16) comprises the steps of providing a plurality of solder elements (17) between the first device and the substrate, aligning the first device, and then reflowing and cooling the solder elements to bond the first device to the substrate. The improvement comprises, first, reflowing only a first group of solder elements and then cooling the elements of the first group, thereby to tack the first device to the substrate. Thereafter, we reflow only a second group of the plurality of solder elements and cool the second group, thereby to provide a more secure bond between the device and the substrate without interfering with the alignment of the first device. This method reduces the amount of energy needed for each fellow step, thereby reducing stresses and maintaining better alignment. In an illustrative embodiment, three groups of solder elements are provided, each group containing four solder elements to be heated by individual heater elements (39). Separate circuits (27, 28, 29) are provided for energizing sequentially the three groups for reflow. Thus, four solder elements are initially reflowed and cooled to provide good tacking between the first device and the substrate. Thereafter, the other groups are actuated sequentially with heat dissipation occurring between each successive actuation. Thermal barriers (34, 38) are preferably included between each heater element and the first device and between the heater element and the substrate to concentrate heat on the solder element (17). The first device is illustratively a laser (11) that is aligned with an optical fiber (12) prior to bonding.

22 Claims, 1 Drawing Sheet

U.S. PATENT DOCUMENTS

| | | | |
|---|---|---|---|
| 4,769,525 | 9/1988 | Leatham | 219/209 |
| 4,788,404 | 11/1988 | Kent | 219/209 |
| 4,807,956 | 2/1989 | Tournereau et al. | 250/227 |
| 4,908,696 | 3/1990 | Ishihara et al. | 257/713 |
| 5,010,233 | 4/1991 | Henschen et al. | 219/209 |
| 5,024,504 | 6/1991 | Boudreau et al. | 350/96.18 |
| 5,042,709 | 8/1991 | Cina et al. | 228/105 |
| 5,090,116 | 2/1992 | Henschen et al. | 29/827 |
| 5,175,409 | 12/1992 | Kent | 219/209 |
| 5,177,595 | 1/1993 | Beatty | 257/727 |
| 5,249,733 | 10/1993 | Brady et al. | 228/223 |
| 5,307,434 | 4/1994 | Blonder et al. | 385/91 |
| 5,384,873 | 1/1995 | Chun et al. | 385/49 |
| 5,539,186 | 7/1996 | Abrami et al. | 219/548 |

ALIGNMENT AND BONDING TECHNIQUES

This is a division of application Ser. No. 08/260,860 filed Jun. 16, 1994, now U.S. Pat. No. 5,568,892.

TECHNICAL FIELD

This invention relates to techniques for assembling devices that are aligned to within very close tolerances and, more particularly, to methods and apparatus for aligning lasers with optical fibers.

BACKGROUND OF THE INVENTION

Transmitters used in optical fiber communications systems typically require a package containing a semiconductor laser coupled to an optical fiber that extends from the package. A major challenge in constructing such transmitters is in maintaining optimal alignment of the laser with the optical fiber such that a maximum part of the laser output can be transmitted through the fiber. A common approach is "active alignment" in which, for example, the laser is bonded to a substrate, and the optical fiber is incrementally moved until a maximum part of the laser output is directed through the fiber, whereupon the optical fiber is permanently bonded to the same substrate. Alternatively, the fiber can be first bonded to the substrate, with the laser being moved into alignment and then bonded.

For a variety of reasons, solder is the favored material for bonding both the optical fiber carrier and the laser carrier to the substrate. During active alignment, the solder contacting the device being aligned is melted or reflowed, the device is held in alignment, and the solder is cooled and solidified. A long recognized problem with this process is that thermal stresses caused by differential thermal expansion of the various elements can be manifested as small movements of the device even after the solder has solidified, resulting in small misalignments. As described, for example, in the Blonder et al., U.S. Pat. No. 5,307,434, granted Apr. 26, 1994, and in references cited therein, one way of reducing such stresses is to localize the heat applied to reflow the solder by using in the solder element bonding pad a tiny resistive heater for generating the heat.

Especially when one seeks to align a laser with a single mode optical fiber, tiny misalignments may significantly reduce the portion of the laser light coupled to the optical fiber. Even with the improvements described in the Blonder et al. patent, for example, misalignments can still occur due to latent thermal stresses produced during the solder reflow step. We have tried using a plurality of small resistively heated solder elements, rather than only one, in an effort to reduce further the thermal stresses. While this provides some improvement, slight misalignments are still a problem.

SUMMARY OF THE INVENTION

The invention is an improvement of a method for aligning and soldering a first device to a substrate comprising the steps of providing a plurality of solder elements between the first device and the substrate, aligning the first device, and then reflowing and cooling the solder elements to bond the first device to the substrate. The improvement comprises, first, reflowing only a first group of the solder elements and then cooling the elements of the first group, thereby to tack the first device to the substrate. Thereafter, we reflow only a second group of the plurality of solder elements and cool the second group, thereby to provide a more secure bond between the device and the substrate without interfering with the alignment of the first device. This method reduces the amount of energy needed for each reflow step, thereby reducing stresses and maintaining better alignment.

In an illustrative embodiment, three groups of solder elements are provided, each group containing four solder elements to be heated by individual heater elements. Separate circuits are provided for energizing sequentially the three groups for reflow. Thus, four solder elements are initially reflowed and cooled to provide good tacking between the first device and the substrate. Thereafter, the other groups are actuated sequentially with heat dissipation occurring between each successive actuation. Thermal barriers are preferably included between each heater element and the first device and between the heater element and the substrate to concentrate heat on the solder element. The first device is illustratively a laser that is aligned with an optical fiber prior to bonding.

These and other objects, features and benefits of the invention will be better understood from a consideration of the following detailed description taken in conjunction with the accompanying drawing.

DETAILED DESCRIPTION

Figure 1:
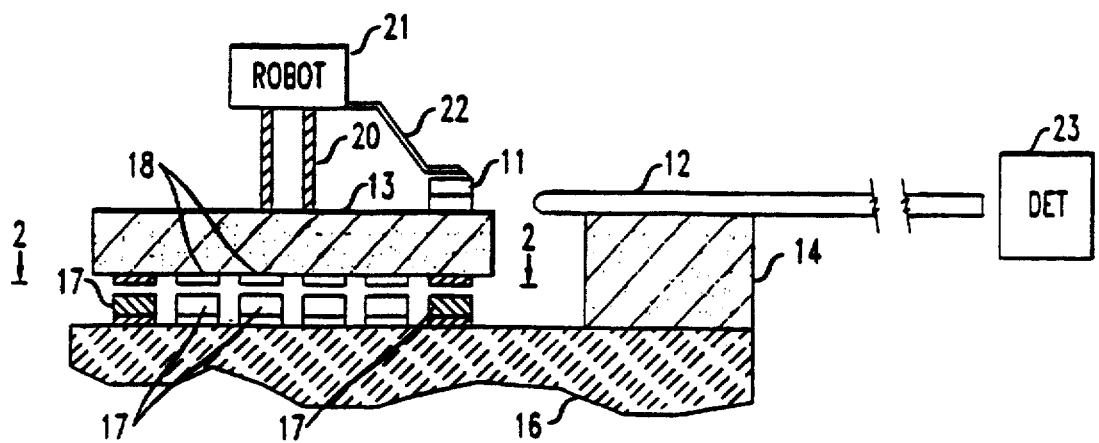
FIG. 1 is a schematic sectional view of apparatus for aligning and bonding an optical device to a substrate in accordance with one embodiment of the invention.

The drawings are all schematic and not necessarily to scale, with dimensions in some cases being intentionally distorted to aid in clarity of exposition. Referring now to FIG. 1, there is shown apparatus for making an optical device package comprising a semiconductor laser 11 in close proximity to and in alignment with an optical fiber 12. The laser 11 is supported on a chip carrier 13, while the optical fiber 12 is supported by a fiber carrier 14. The fiber carrier 14 is bonded to a substrate 16 which includes a plurality of solder elements 17. The chip carrier 13 comprises a plurality of bonding pads 18 each of which corresponds to one of the solder elements 17.

The chip carrier 13 is held by a vacuum chuck 20 which is controlled by a robot 21 that is capable of moving the chip carrier and the laser 11 in mutually orthogonal X, Y and Z directions. The laser 11 is illustratively actuated by current directed through a probe 22 which may be spring biased against the laser 11. Actuation of the laser causes it to emit light which is directed into the optical fiber 12 and detected by a detector 23, in accordance with the well known method of active alignment. Robot 21 incrementally moves laser 11 until a maximum quantity of light is detected by detector 23, which indicates optimum alignment between the laser 11 and the optical fiber 12. Particularly if the optical fiber 12 is a single mode fiber, it is important to align the laser to tolerances that may be as small as one micron or even less than one micron.

During the alignment step, the bonding pads 18 may either be in contact with solder elements 17 or separated from them by a very small distance as shown. When optimum alignment is achieved, the solder elements 17 are reflowed, or melted, which causes them to contact bonding pads 18. Thereafter, the solder elements are cooled and solidified so that a firm bond is made between chip carrier 13 and substrate 16 with the laser 11 in alignment with optical fiber 12. The vacuum applied by vacuum chuck 20 is then released. This may, for example, constitute part of the process for making an optical transmitter package.

The use of a plurality of solder elements 17 for making the bond is preferable to a single, more massive, solder element because the use of a plurality of elements reduces the heat required for reflow and thus reduces thermal stresses on the chip carrier 13. Even with this provision, thermal stresses could be such that, after the solder elements have solidified, sufficient latent stresses are produced in the structure that, when the vacuum chuck 20 is released, the laser 11 might move out of optimum alignment with optical fiber 12.

Figure 2:
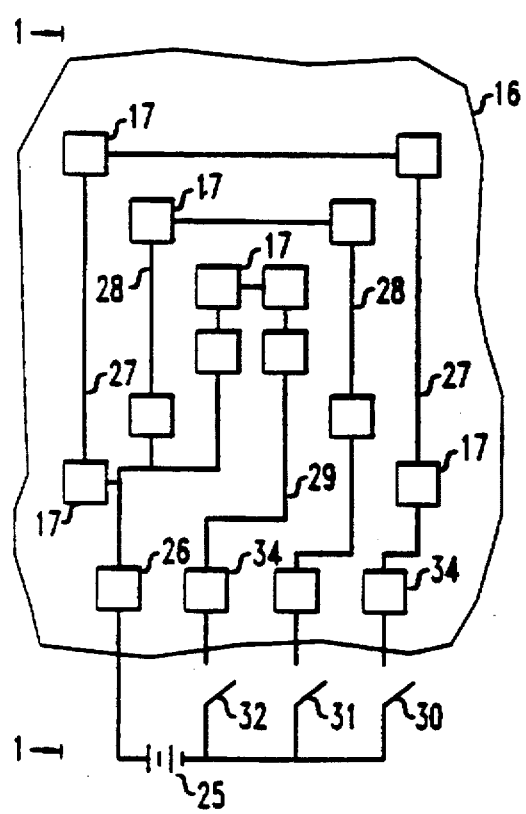
FIG. 2 is a view taken along lines 2—2 of FIG. 1.

In accordance with the invention, this problem is reduced or eliminated by arranging the solder elements 17 into groups, and then sequentially reflowing and cooling the groups. This is most expediently done by incorporating a resistive heating element with each solder element 17 and using a separate electrical circuit to actuate the heater elements of each group. Referring to FIG. 2, a battery 25 is used to actuate sequentially the heater elements associated with the various solder elements 17. All of the circuits of FIG. 2 are connected via a connector pad 26 to the positive side of the battery 25. Three different groups of solder elements are defined by three separate circuits 27, 28 and 29, each connected to a connector pad 34 which may be selectively connected to the positive pole of battery 25.

When a switch 30 is closed, electrical circuit 27 is completed, which actuates the heater elements associated with the four outer solder elements 17. Thus, these four outer solder elements are reflowed, while contacting a bonding pad 18 of the chip carrier 13. Thereafter, switch 30 is opened so that the reflowed elements may solidify and tack the chip carrier 13 to substrate 16. Next, a switch 31 is closed, which completes electrical circuit 28, thereby heating a middle group of four solder elements 17. After this group has been reflowed, the switch 31 is opened so that the elements of the middle group may cool and solidify. Thereafter, switch 32 is closed to actuate circuit 29, thereby reflowing the inner group of four solder elements 17. After reflow, switch 32 is opened, and the solder elements 17 are solidified to complete the bonding step.

The initial heating of the outer four solder elements 17 does not transfer sufficient heat to the chip carrier 13 to cause harmful thermal stress. Such stress as does occur is manifested as a distortion of the solder elements because the solder elements that have cooled are of insufficient mass to affect the chip carrier. The next group connected by circuit 28 is actuated only after the heat of the first group has been dissipated. In this manner, heat to the system is sequentially dissipated and thermal stress is absorbed substantially entirely by the solder elements.

Figure 3:
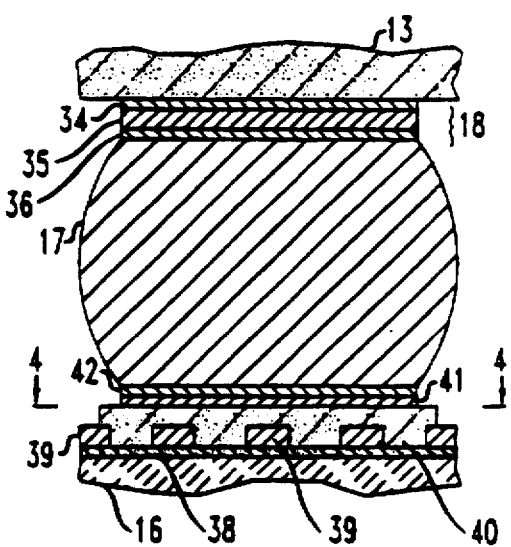
FIG. 3 is a schematic view of a solder element and associated heater element as may be used in the apparatus of FIG. 1.

Referring to FIG. 3, there is shown a schematic view of an illustrative solder element 17 after it has been bonded to the chip carrier 13. The chip carrier 13 may be silicon upon which is formed a layer of silicon dioxide 34 which acts as a thermal barrier during the reflow process. Over this are deposited layers of chromium 35 and gold 36. Alternatively, the metallization may be titanium-platinum-gold, as is known in the art.

Figure 4:
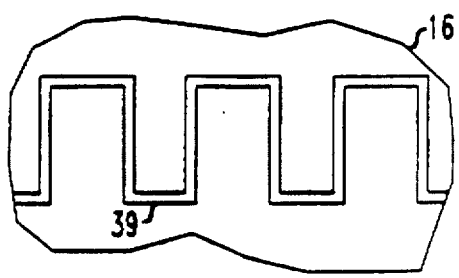
FIG. 4 is a view taken along lines 4—4 of FIG. 3.

The bonding pad to the substrate includes a layer of silicon dioxide ($SiO_2$) 38 over which is formed the resistive heater 39, which may be a nickel-chromium alloy. Over the heater, a silicon dioxide layer 40 is formed, which acts as an electrical insulator for the heater element. Layers 41 and 42 may be chromium and gold, as described previously. As shown in FIG. 4, the resistive heater 39 may comprise a serpentine strip of metal designed to provide sufficient electrical resistance to provide the heat needed for reflowing a corresponding one of the solder elements 17. Of course, the circuitry 27, 28 and 29 of FIG. 2 that interconnects the resistive heater elements 39 of FIG. 4 are designed as not to generate significant heat.

An important aspect of the structure of FIG. 3 is that both the heater element 39 and the solder elements 17 are contained between silicon dioxide thermal barriers 34 and 38. These thermal barriers contain the heat within the solder elements 17, thereby further to reduce thermal stresses, particularly in chip carrier 13.

The following Table I summarizes illustrative information concerning the various layers of FIG. 3:

TABLE I

| Reference No. | Material | Function | Thickness |
| --- | --- | --- | --- |
| 34 | $SiO_2$ | Thermal Barrier | 2 micrometers |
| 35 | Chromium | Adhesion Layer | 1000 angstroms |
| 36 | Gold | Adhesion Layer | 1000 angstroms |
| 42 | Gold | Adhesion Layer | 1000 angstroms |
| 41 | Chromium | Adhesion Layer | 1000 angstroms |
| 40 | Silicon Dioxide | Electrical Insulation | 1000 angstroms |
| 39 | Nickel-Chromium | Electrical Heater | 2500 angstroms |
| 38 | $SiO_2$ | Electrical Insulation & Thermal Barrier | 10 micrometers |

The conductor lines 27, 28 and 29 may be made of chromium with a thickness of 2000 angstroms. Chip carrier 13 is preferably silicon which acts as a heat sink for laser 11. Fiber carrier 14 is also preferably silicon in which a V-groove has been etched for support of fiber 12, and which is soldered to substrate 16, which may be made of ceramic. Solder elements 17 may have a length and a width of one hundred micrometers, a height of twenty-five to thirty micrometers, and be a soft solder of sixty-three percent lead and thirty-seven percent tin. If bonding pads 18 are held within five micrometers of elements 17, when the elements 17 are reflowed, their heights will increase, due to "bailing up," to bear against pads 18. Alternatively, such soft solder can be significantly compressed during the alignment process if bonding pads 18 bear against elements 17 in their solid state.

In the embodiment shown, twelve solder elements 17, arranged into three groups of four solder elements each, have been found to provide solid and reliable bonding which will maintain a laser 11 in permanent alignment to an optical fiber. The number, size and arrangement of solder elements, the number of groups, and the number of solder elements in each group, are, of course, matters of design, and they may vary depending upon particular device package requirements. The invention, in general, provides for reflow in at least two separate steps such that the heat generated by the reflowing of a first group is dissipated prior to the heating of a second group of solder elements. Electrical heaters are a convenient known devices for providing the heat, but it is conceivable that such methods as laser heating could alternatively be used. The invention could of course be used to align an optical fiber with a fixed laser, as well as aligning other devices. A mechanical chuck could be used in place of vacuum check 20 and any of various kinds of apparatus could be used in place of robot 21. Other embodiments and modifications may be made by those skilled in the art without departing from the spirit and scope of the invention.

I claim:

1. In combination:

a first device;

a substrate;

a plurality of solder elements between the first device and the substrate;

a resistive heater element associated with each of the plurality of solder elements;

and means for reflowing the plurality of solder elements wherein the resistive heater elements associated with predetermined numbers of the plurality of solder elements are sequentially energized to reflow the solder elements and bond the first device with the substrate.

2. The combination of claim 1 further comprising:

means for holding the first device in alignment with a second device during reflow of said solder elements so as to cause the solder elements sequentially to adhere to, and to bond together, the first device and the substrate.

3. The combination of claim 1 further comprising:

a first electrical circuit interconnecting a first group of the resistive heater elements;

a second electrical circuit interconnecting a second group of the resistive heater elements;

a third electrical circuit interconnecting a third group of the resistive heater elements;

and wherein the reflow means sequentially directs electrical current through the first, second and third electrical circuits.

4. The combination of claim 3 wherein:

each group comprises more than one resistive heater element.

5. The combination of claim 4 further comprising:

means for holding the first device in alignment until after electrical current has been directed through all of said electrical circuits.

6. The combination of claim 1 wherein:

said first device is a first optical device in alignment with a second optical device.

7. The combination of claim 1 wherein:

the first device comprises a laser in alignment with an optical fiber.

8. The combination of claim 7 wherein:

the first device comprises a laser mounted on a chip carrier;

the solder elements constitute means for bonding the chip carrier to the substrate;

and the optical fiber is bonded to the substrate.

9. The combination of claim 8 further comprising:

means for holding the laser in alignment with the optical fiber during reflow of the solder elements.

10. The combination of claim 9 further comprising:

a first electrical circuit interconnecting a first group of said resistive heater elements;

a second electrical circuit interconnecting a second group of said resistive heater elements;

and wherein the reflow means sequentially directs electrical current through the first and second electrical circuits.

11. The combination of claim 1 wherein:

the reflow means comprises means for first reflowing only a first group of said solder elements, and thereafter reflowing only a second group of said solder elements which is different from the first group.

12. The combination of claim 11 wherein:

the reflow means comprises a resistive heater element associated with each solder element and means for first energizing only those resistive heater elements associated with solder elements of the first group, and thereafter energizing only those resistive heater elements associated with solder elements of the second group.

13. The combination of claim 1 wherein:

there is included between each solder element and the first device an insulative layer.

14. The combination of claim 13 wherein:

the insulative layer is silicon dioxide.

15. An optical device package comprising:

a first optical device in alignment with a second optical device;

the first optical device being bonded to a substrate by a plurality of groups of solder elements;

a heater element closely adjacent to each solder element;

the heater elements associated with each group of solder elements being connected to a separate electrical circuit, whereby actuation of each electrical circuit allows separate heating of the heater element associated with one group of solder elements without significantly heating the solder elements of the other groups.

16. The optical device package of claim 15 wherein:

each solder element and its corresponding heater element are separated from the first optical device by a first thermal barrier and from the substrate by a second thermal barrier.

17. The package of claim 15 wherein:

the first device is a laser, and the second device is an optical fiber.

18. The package of claim 17 wherein:

the laser and the optical fiber are both bonded to a common substrate.

19. The package of claim 18 wherein:

the laser is bonded to a chip carrier which is bonded to said substrate, and said optical fiber is bonded to a fiber carrier which is bonded to said substrate.

20. The package of claim 19 wherein:

each group comprises at least three solder elements and the plurality of groups comprises at least three groups.

21. The package of claim 20 further comprising:

switching means for first actuating a first electrical circuit associated with the first group, then deactuating the first circuit, then actuating a second electrical circuit associated with the second group, then deactuating the second circuit, then actuating a a third electrical circuit associated with the third group, and then deactuating the third circuit.

22. The package of claim 16 wherein:

the first and second thermal barriers are both of silicon dioxide.

* * * * *